United States Patent
Saeki

(10) Patent No.: US 6,441,657 B1
(45) Date of Patent: *Aug. 27, 2002

(54) COMBINATIONAL DELAY CIRCUIT FOR A DIGITAL FREQUENCY MULTIPLIER

(75) Inventor: Takanori Saeki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/086,567

(22) Filed: May 29, 1998

(30) Foreign Application Priority Data

May 30, 1997 (JP) .............................. 9-157853

(51) Int. Cl.[7] .............................. H03B 19/00

(52) U.S. Cl. ...................... 327/119; 327/152; 327/153; 327/158; 327/161

(58) Field of Search ...................... 327/116, 119–1.21, 327/149, 150, 152, 153, 158, 159, 161, 244, 245, 270, 271, 276–278, 284; 377/47, 48

(56) References Cited

U.S. PATENT DOCUMENTS

| | | | |
|---|---|---|---|
| 5,216,301 A | 6/1993 | Gleeson, III et al. ........ | 327/119 |
| 5,245,231 A | 9/1993 | Kocis et al. ................. | 327/277 |
| 5,260,608 A | 11/1993 | Marbot ........................ | 327/261 |
| 5,321,734 A | 6/1994 | Ogata ........................... | 377/47 |
| 5,422,835 A | 6/1995 | Houle et al. ................. | 708/103 |
| 5,514,990 A | 5/1996 | Mukaine et al. ............ | 327/115 |
| 5,530,387 A | 6/1996 | Kim ............................. | 327/119 |
| 5,544,203 A | 8/1996 | Casasanta et al. .......... | 375/376 |

(List continued on next page.)

FOREIGN PATENT DOCUMENTS

EP 0 762 262 A1 3/1997

OTHER PUBLICATIONS

Yang et al., "FP 12.4: A 0.8µm CMOS 2.5Gb/s Oversampled Receiver for Serial Links", *1996 IEEE International Solid–State Circuits Conference,* Feb. 9, 1996, pp. 200–201.
Shimizu et al., "FP 13.4: A Multimedia 32b RISC Microprocessor with 16Mb DRAM", *1996 IEEE International Solid–State Circuits Conference,* Feb. 9, 1996, pp. 216–217.
Michel Combes et al., "A Portable Clock Multiplier Generator Using Digital CMOS Standard Cells", *IEEE Journal of Solid State Circuits,* vol. 31, No. 7, Jul. 1996, pp. 958–965.
Toru Shimizu et al., "A Multimedia 32B RISC Microprocessor with 16 MB DRAM", *IEEE International Solid State Circuits Conference,* vol. 39, Feb. 1996, pp. 216, 217 and 448.
T. Shimizu, "A Multimedia 32b RISC Microprocessor with 16 Mb DRAM", ISSC Digest of Technical Papers, 1996 IEEE International Solid–State Conference, pp. 216–217, Feb. 1996.

*Primary Examiner*—Tuan T. Lam
(74) *Attorney, Agent, or Firm*—Sughrue Mion, PLLC

(57) ABSTRACT

A combination delay circuit for use in a frequency multiplier comprises a first delay circuit including a plurality of delay lines each having eight segments each effecting a unit delay time $t_d$, a latch array having 8 latch elements, one element disposed for each delay line, each receiving an output from a corresponding one of delay segments, and second through eighth delay circuits each having a single delay element effecting the unit delay time. The corresponding between the latch elements and the second through eighth delay circuits is such that delay times in the outputs of the third, fifth, seventh delay circuits are ¼, ½ and ¾, respectively, of the delay times in the output of the eighth delay circuit. The frequency multiplier having the combinational delay circuit multiplies the reference frequency by double, quadruple, and octuple.

4 Claims, 5 Drawing Sheets

U.S. PATENT DOCUMENTS

| | | | |
|---|---|---|---|
| 5,633,608 A | 5/1997 | Danger | 327/270 |
| 5,699,003 A | 12/1997 | Saeki | 327/261 |
| 5,767,712 A * | 6/1998 | Takemae et al. | 327/152 |
| 5,801,559 A * | 9/1998 | Sawai et al. | 327/116 |
| 5,818,890 A * | 10/1998 | Ford et al. | 375/371 |
| 5,901,190 A * | 5/1999 | Lee | 375/373 |
| 5,909,133 A * | 6/1999 | Park | 327/277 |
| 6,016,064 A | 1/2000 | Saeki | 326/121 |
| 6,060,920 A | 5/2000 | Saeki | 327/152 |

* cited by examiner

COMBINATIONAL DELAY CIRCUIT FOR A DIGITAL FREQUENCY MULTIPLIER

BACKGROUND OF THE INVENTION (a) Field of the Invention

The present invention relates to a combinational delay circuit for a digital frequency multiplier and, more particularly, to a combinational delay circuit capable of fine adjustment of a delay time.

(b) Description of the Related Art

A digital frequency multiplier is generally used for generating a clock signal having a higher frequency and a clock phase in synchrony with the phase of an input reference clock signal. Such a digital frequency multiplier is described, for example, by T. Shimizu in "A Multimedia 32b RISC Microprocessor with 16 Mb DRAM", ISSCC Digest of Technical Papers, 1996 IEEE International Solid-state Circuit Conference, pp.216 to 217, Feb. 1996. Patent Publications U.S. Pat. Nos. 5,422,835 and 5,530,837 also describe related devices.

FIG. 1 shows a conventional combinational delay circuit in a frequency multiplier capable of quadruple-multiplying the clock frequency of a reference clock signal. Four delay sets each including an individual delay circuit 101, 102, 103 or 104 and a selector 105, 106, 107 or 108 are serially cascaded from one another for receiving a reference (first) clock signal 111 to generate second through fifth clock signals 112 to 115. In each delay set, the delay time of the delay circuit 101, 102, 103 or 104 is controlled by a corresponding one of the selectors 105, 106, 107 and 108 to have a plurality of unit delay times ($t_d$), wherein $t_d$ is a unit delay time effected by each of the delay segments having an equal configuration.

A phase comparator 109 compares the fifth clock signal 115 against the reference clock signal 111 to supply either UP-signal 116 or DOWN-signal 117 to an UP/DOWN (U/D) counter 110 depending on the phase of the fifth clock signal 115 relative to the phase of the reference clock signal 111. The U/D counter 110 supplies a control signal 118 for controlling the selectors 105 to 108 to equalize the phase of the fifth clock signal 115 with that of the reference clock signal 111.

By the above control, since time delays of the respective delay circuits 101 to 104 are controlled by the single control signal 118, the timing difference between each consecutive two of the clock signals 112 to 115 is equal to ¼ of the clock cycle of the reference clock signal 111. By making a logical sum (OR) of the four clock signals 112 to 115, a quadruple-multiplication of the reference clock signal 111 can be effected to generate a clock signal having a quadruple-multiplied frequency.

Table 1 shows the relationship between the desired total phase delay of the cascaded delay circuits 101 to 104 and the delays actually effected by the respective delay circuits 101 to 104 in the combinational delay circuit of FIG. 1.

TABLE 1

| Total phase delay | Delay circuit 101 | Delay circuit 102 | Delay circuit 103 | Delay circuit 104 |
| --- | --- | --- | --- | --- |
| 1 | 1 | 1 | 1 | 1 |
| 2 | 1 | 1 | 1 | 1 |
| 3 | 1 | 1 | 1 | 1 |
| 4 | 1 | 1 | 1 | 1 |
| 5 | 2 | 2 | 2 | 2 |
| 6 | 2 | 2 | 2 | 2 |
| 7 | 2 | 2 | 2 | 2 |
| 8 | 2 | 2 | 2 | 2 |
| 9 | 3 | 3 | 3 | 3 |
| 10 | 3 | 3 | 3 | 3 |
| 11 | 3 | 3 | 3 | 3 |
| 12 | 3 | 3 | 3 | 3 |
| 13 | 4 | 4 | 4 | 4 |
| 14 | 4 | 4 | 4 | 4 |
| 15 | 4 | 4 | 4 | 4 |
| 16 | 4 | 4 | 4 | 4 |
| 17 | 5 | 5 | 5 | 5 |
| 18 | 5 | 5 | 5 | 5 |
| 19 | 5 | 5 | 5 | 5 |
| 20 | 5 | 5 | 5 | 5 |

Table 2 shows the relationship between the total phase delay and the outputs 112 to 115 of the respective delay circuits 101 to 104, which is obtained from Table 1.

TABLE 2

| Total phase delay | Output clock 112 | Output clock 113 | Output clock 114 | Output clock 115 |
| --- | --- | --- | --- | --- |
| 1 | 1 | 2 | 3 | 4 |
| 2 | 1 | 2 | 3 | 4 |
| 3 | 1 | 2 | 3 | 4 |
| 4 | 1 | 2 | 3 | 4 |
| 5 | 2 | 4 | 6 | 8 |
| 6 | 2 | 4 | 6 | 8 |
| 7 | 2 | 4 | 6 | 8 |
| 8 | 2 | 4 | 6 | 8 |
| 9 | 3 | 6 | 9 | 12 |
| 10 | 3 | 6 | 9 | 12 |
| 11 | 3 | 6 | 9 | 12 |
| 12 | 3 | 6 | 9 | 12 |
| 13 | 4 | 8 | 12 | 16 |
| 14 | 4 | 8 | 12 | 16 |
| 15 | 4 | 8 | 12 | 16 |
| 16 | 4 | 8 | 12 | 16 |
| 17 | 5 | 10 | 15 | 20 |
| 18 | 5 | 10 | 15 | 20 |
| 19 | 5 | 10 | 15 | 20 |
| 20 | 5 | 10 | 15 | 20 |

As shown in Tables 1 and 2, the frequency multiplier having the combinational delay circuit described above generates output clock signals having a unit delay which is a quadruple of the unit delay time ($t_d$) of each delay circuit. More specifically, the resultant quadruple frequency multiplier cannot adjust the time delay as fine as within four times the unit delay time of each delay circuit, and the error of the clock cycle of the clock signal generated by the frequency multiplier is as high as $3 \times t_d$ at a maximum.

Specifically, if a total phase delay of 5 unit delays ($5 \times t_d$) is to be effected, for example, each delay circuit selects 2 delay units ($2 \times t_d$), whereby the output of the fifth clock signal 115 has a phase delay of 8 unit delays ($8 \times t_d$) with respect to the reference clock signal 111, which means the presence of an error of $3 \times t_d$ in the timing of the clock pulse generated by the fifth delay circuit and preceding the clock pulse corresponding to the next pulse in the reference clock signal.

More generally, the error of the phase of the clocks in the output of the frequency multiplier after the logical sum of the respective outputs of the delay circuits resides mostly at specified clocks.

SUMMARY OF THE INVENTION

It is therefore an object of the present invention to provide a combinational delay circuit for use in a frequency multiplier, which is capable of outputting a multiplied clock signal having a minimum adjustable delay time substantially equal to the unit delay time of the delay segments of the delay circuits.

It is another object of the present invention to provide a combinational delay circuit, wherein errors of the phase of the clock pulses are substantially uniformly distributed among the clock pulses.

The present invention provides, in one aspect, a combinational delay circuit comprising a first delay circuit having at least one basic delay line including a plurality of cascaded delay segments each effecting a unit time delay, a latch array having a plurality of latch elements each receiving an output from a corresponding one of the delay segments, a plurality of second delay circuits coupled to one another in a cascaded configuration, each of the second delay circuits having a delay element corresponding to said delay line for effecting a time delay substantially equal to the unit time delay, the delay element in each of the second delay circuits receiving an output from a corresponding one of the latch elements by responding to an output from a preceding one of the second delay circuits in terms of the cascaded configuration.

The present invention also provides, in another aspect, a combinational delay circuit for multiplying a frequency of an reference clock signal, comprising a plurality of cascaded delay sets each including a delay circuit having a plurality of cascaded delay segments, each such delay segment effecting a unit time delay; a selector for selecting an output from one of the delay segments as an output of the delay sets, a phase comparator for comparing the phase of an output of a last stage of the cascaded delay circuits against the phase of the reference clock signal, to output a phase difference signal, and a control section for responding to the phase difference signal to control one of the selectors for the selection of one of the delay circuits, the one of the selectors being specified based on a predetermined order of selection depending on the phase difference signal.

In accordance with the combinational delay circuit of the present invention, a frequency multiplier having the combinational delay circuit allows a fine adjustment of the clock delay with respect to the reference clock. In addition, the timing of the clock pulses is controlled so that the error is substantially distributed among the clock pulses.

The above and other objects, features and advantages of the present invention will be more apparent from the following description, referring to the accompanying drawings.

DESCRIPTION OF THE PREFERRED EMBODIMENTS

Figure 1:
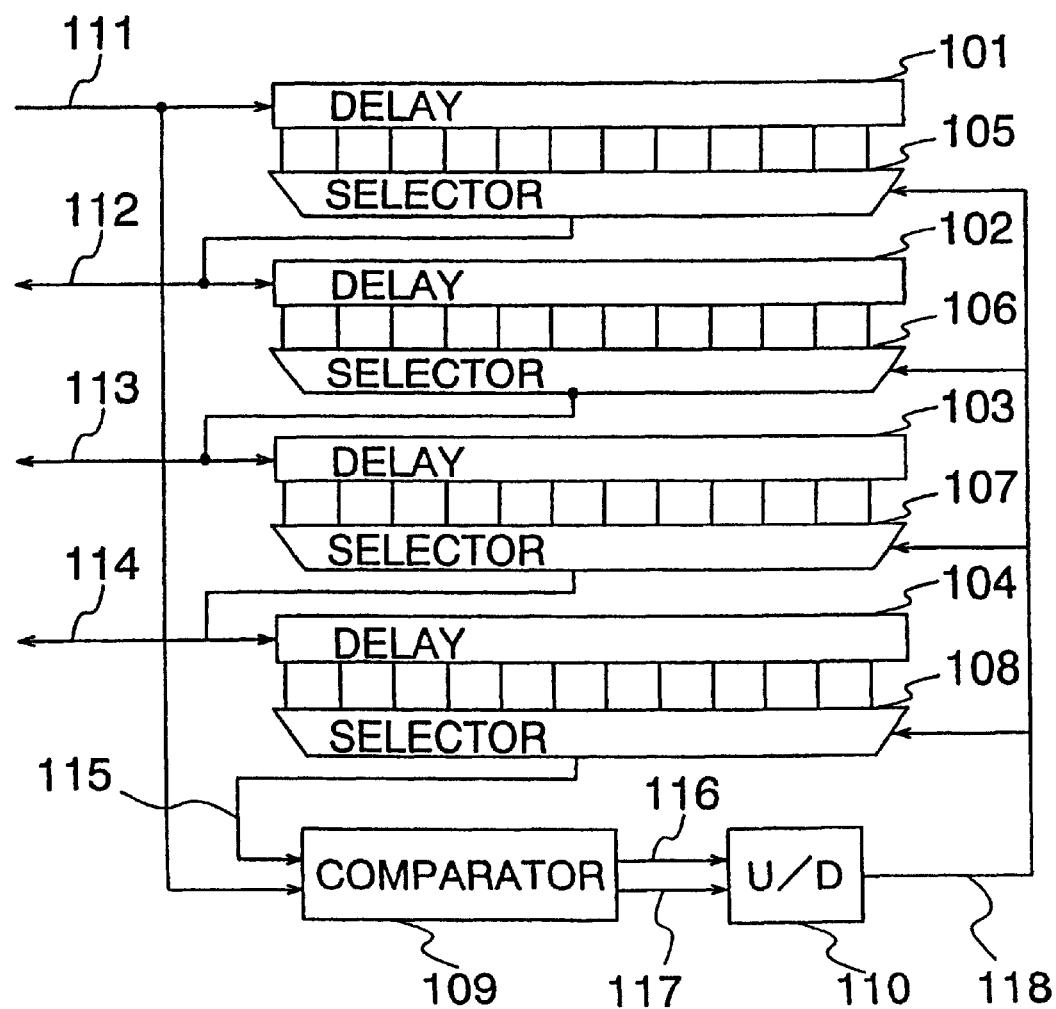
FIG. 1 is a block diagram of a conventional combinational delay circuit for a frequency multiplier.

Now, the present invention is more specifically described with reference to the accompanying drawings Referring to FIG. 2, a combinational delay circuit according to a first embodiment of the present invention comprises a first delay circuit 201 having a first clock buffer 211 and a plurality of (M) basic delay lines, one of which is shown as encircled by dotted line 210 which defines a unit section of the combinational delay circuit, which are serially cascaded from one another, and each of which includes a plurality of (8 in this embodiment) delay segments 230. Each delay segment 230 effects a unit delay time $t_d$.

The combinational delay circuit further comprises: a latch array 209 including M latch sections each corresponding to one of the unit sections 210 and including a plurality of (8 in this embodiment) latch elements 231 corresponding to the delay segments 230 of the delay line of the first delay circuit 201; second through eighth delay circuits 202 to 208 each having a second clock buffer (213, 214, . . . , 219) and a single delay segment 232, which has the same unit delay time $t_d$ as the delay segments 230 of the first delay circuit 201 corresponding to one of the unit sections 210; and a third clock buffer 212 for receiving the reference signal 220.

Figure 3:
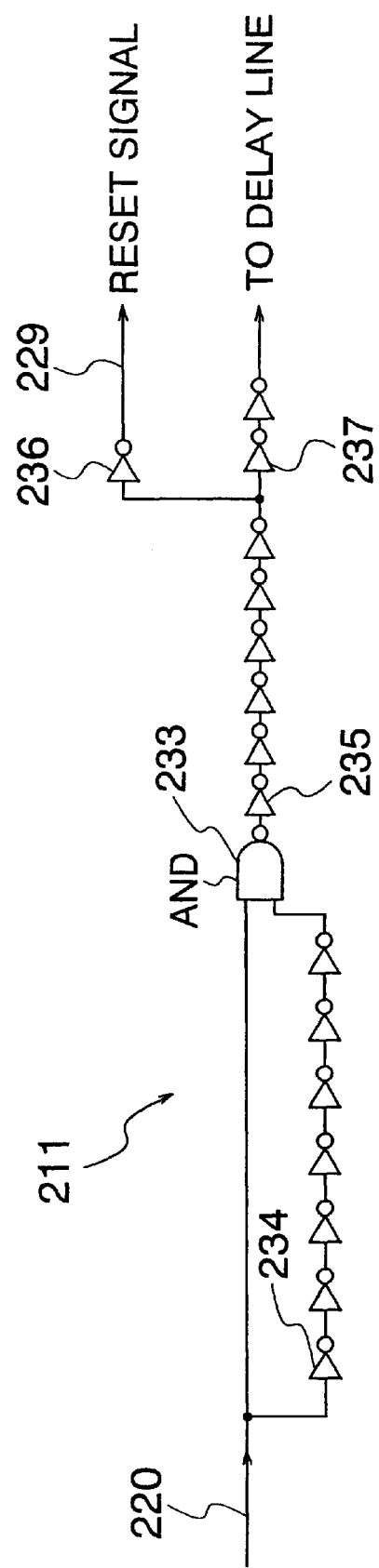
FIG. 3 is a detailed circuit diagram of the clock buffer 211 shown in FIG. 2.

Referring to FIG. 3, the first clock buffer 211 comprises a NAND gate 233 for receiving the reference clock signal 220 directly at the first input thereof and through a plurality of (7 in this embodiment) cascaded inverters 234 at the second input thereof, to generate a one-shot pulse having a considerably smaller width than the reference clock signal 220, a plurality of (6 in this embodiment) cascaded inverters 235 for receiving an output from the NAND gate 233, an inverter 236 for receiving an output from the cascaded inverters 235 to output a reset signal 229, and a pair of inverters 237 for receiving an output from the cascaded inverters 235 to output a delayed inverted one-shot signal to the first delay line of the first delay circuit 201. The reset signal 229 is used to reset the delay lines in the first delay circuit 201 at each clock cycle.

Figure 2:
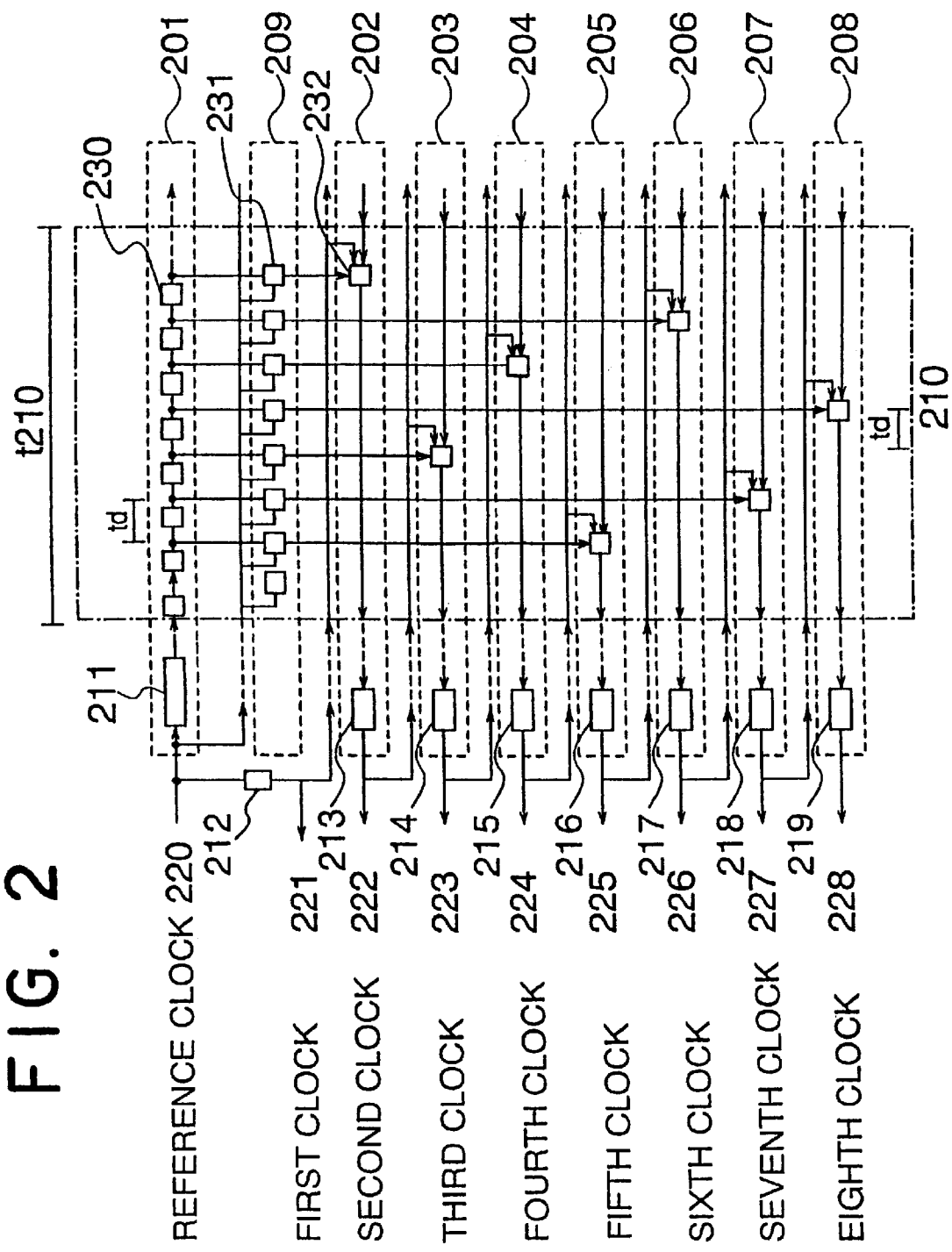
FIG. 2 is a block diagram of a combinational delay circuit according to a first embodiment of the present invention.
Figure 4:
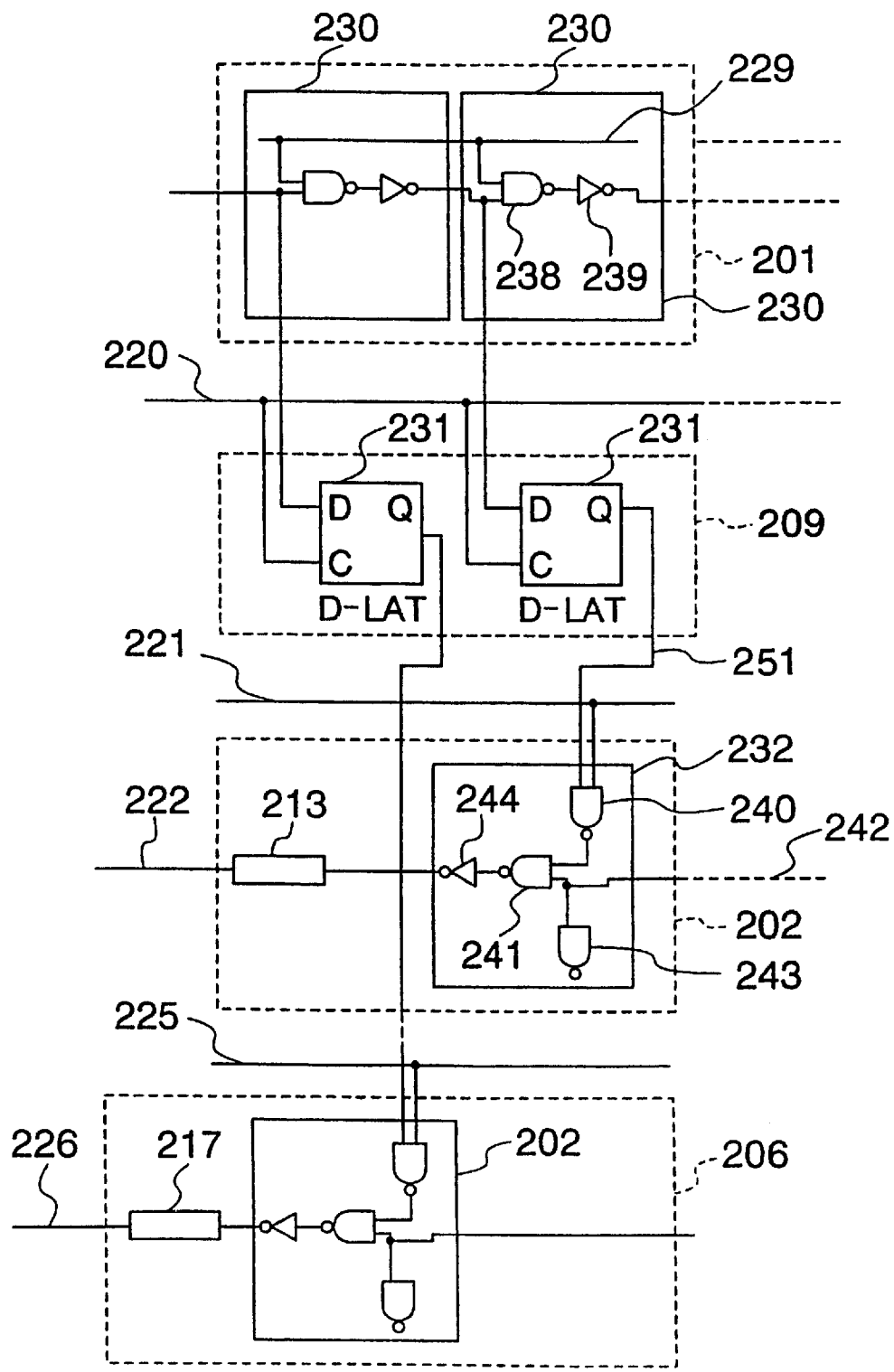
FIG. 4 is a detailed circuit diagram of the respective delay circuits and the latch array shown in FIG. 2.

Referring to FIG. 4, there are shown typical connections among the delay circuits 201 to 208 and the latch array 209 shown in FIG. 2. Each delay segment 230 of the first delay circuit 201 comprises a NAND gate 238 and an inverter 239 for receiving an output from the preceding delay segment 230 to deliver a delay signal to the subsequent delay segment 230. The output of each delay segment 230 is also supplied to a corresponding one of the latch elements 231, each implemented by a D-flipflop, at the data input D thereof. The latch element 231 receives the reference clock signal 220 at the clock input C thereof to fix and deliver an output to the delay element 232 of the corresponding delay circuit.

The delay element 232 of each delay circuit 202, 203, . . . , or 208 comprises a first NAND gate 240 for receiving an output clock signal 221, 222, . . . , 227 from the preceding delay circuit and an output 251 from a corresponding one of the latch elements 231 at both the inputs thereof, a second NAND gate 241 for receiving an output from a first NAND gate 240 and an output 242 from a preceding delay element 232 in the same delay circuit, a third NAND gate 243 acting as a load element for the output 242, and an inverter 244 for receiving an output from the second NAND gate 241 to deliver the output of the delay element 232. In this configuration of the second through eighth delay circuits, the delay element 232 selects either an output 251 from the latch array 209 or an output 242 from the preceding delay element 232. Specifically, the output 222, 223, . . . , or 227 of each of the second through seventh delay circuits 202 to 207, which is delivered through the clock buffer 213, 214, . . . , 219 from the delay element 232, is used as a gate for the output from the latch array. The first through the eighth clock signals 221 to 228 are ORed to provide a clock signal having a frequency which is octuple (8-fold) of the frequency of the reference clock signal 220.

For example, if an output from the eighth latch element 231 in the latch array 209 is set at H-level, the NAND gate 240 of the delay element 232 of the second delay circuit 202 receives a clock pulse in the signal 221 to output a L-level signal, which is delivered to NAND gate 241 and the inverter 244, which delivers the second clock signal 222. If the output from the latch element 231 is low, clock signal 242 from a preceding delay line is supplied to the inverter 244.

As shown in FIG. 2, the first delay circuit 201 has first through eighth delay segments 230 in each of the delay lines. The first delay segments 231 simply delays the clock signal and the second through eighth delay segments supply outputs to the second through eight latch elements 231, respectively. The first latch element 231 is not in service. The delay element 232 in the second delay circuit receives an output from the eighth latch element, i.e., the second delay circuit 202 corresponds to the eighth latch element 231. Similarly, third through eight delay circuits 203 to 208 correspond to fourth, second, sixth, seventh, third and fifth latch elements, respectively. This particular connection scheme itself provides an advantage as will be described later. In these configurations, the second through eight delay circuits are cascaded in series.

In operation, the reference clock signal 220 having a clock cycle (period) of $t_{CK}$ is input to the clock buffer 211 of the first delay circuit 201, which determines the pulse width a $t_{PW}$, which is larger than the delay $t_{210}$ of the basic delay line of the first delay circuit 201, wherein $t_{210}$ is $8 \times t_d$.

While the pulse train having a pulse width $t_{PW}$ advances in the first delay circuit 201, the level of output Q of each latch element 231 of the latch array 209 is changed from L-level, then H-level and to L-level. The number of activated basic delay lines in the first delay circuit 201 is determined based on the clock cycle of the reference clock signal 220 input to the data input of the latch array 209.

Since the pulse width $t_{PW}$ is longer than the time delay $t_{210}$ ($t_{210}=8 \times t_d$) of the basic delay line of the first delay circuit 201, H-level continues for more than $8 \times t_d$ at the respective output terminals of the delay circuit 201 connected to the latch array 209.

While the first clock pulse from the first clock buffer 211 advances in the first delay circuit 201, a second clock pulse enters the latch array 209.

After a latch element 231 having an input D assuming H-level receives the second clock pulse at input C thereof, the latch element 231 fixes the output Q thereof at H-level, thereby enables the delay element 232 of a corresponding one of the second through eighth delay circuits 202 to 208.

The clock pulse passed by the latch array 209 to one of the second through eighth delay circuits 202 to 208, for example, second delay circuit 202, then advances through the subsequent third through eighth delay circuits 203 to 208.

In the above embodiment, a single delay element 232 is provided in each of the second through eighth delay circuits 202 to 208 corresponding to the basic delay unit 210 effecting 8 unit time delays in the first delay circuit 201. In addition, the time delay of each clock buffer 213, 214, . . . or 219 is ⅛ of the time delay of the first clock buffer 211.

As a result, the time delay at which the clock pulse passes each of the delay circuits 202 to 208 is roughly ⅛ of the time delay effected by the first delay circuit 201, although the presence of minimum time delay $t_d$ retards the exact value of ⅛ due to a remainder in division by 8.

Table 3 shows the time delay in terms of a number of unit delay times effected in each of the second through eighth delay circuits 202 to 208 tabulated with the delay time in terms of a number of unit delay times effected in the first delay circuit 201. Table 4 is obtained from Table 3 and shows the time delay in terms of a number of unit delay times appearing in the output of each of the second through eighth delay circuits 202 to 208 tabulated with the time delay in terms of a number of the unit delay times effected in the first delay circuit

TABLE 3

| 201 | 202 | 203 | 204 | 205 | 206 | 207 | 208 |
|---|---|---|---|---|---|---|---|
| 1 | 0 | 0 | 0 | 0 | 0 | 0 | 0 |
| 2 | 0 | 0 | 0 | 1 | 0 | 0 | 0 |
| 3 | 0 | 0 | 0 | 1 | 0 | 1 | 0 |
| 4 | 0 | 1 | 0 | 1 | 0 | 1 | 0 |
| 5 | 0 | 1 | 0 | 1 | 0 | 1 | 1 |
| 6 | 0 | 1 | 1 | 1 | 0 | 1 | 1 |
| 7 | 0 | 1 | 1 | 1 | 1 | 1 | 1 |
| 8 | 1 | 1 | 1 | 1 | 1 | 1 | 1 |
| 9 | 1 | 1 | 1 | 1 | 1 | 1 | 1 |
| 10 | 1 | 1 | 1 | 2 | 1 | 1 | 1 |
| 11 | 1 | 1 | 1 | 2 | 1 | 2 | 1 |
| 12 | 1 | 2 | 1 | 2 | 1 | 2 | 1 |
| 13 | 1 | 2 | 1 | 2 | 1 | 2 | 2 |
| 14 | 1 | 2 | 2 | 2 | 1 | 2 | 2 |
| 15 | 1 | 2 | 2 | 2 | 2 | 2 | 2 |
| 16 | 2 | 2 | 2 | 2 | 2 | 2 | 2 |
| 17 | 2 | 2 | 2 | 2 | 2 | 2 | 2 |
| 18 | 2 | 2 | 2 | 3 | 2 | 2 | 2 |
| 19 | 2 | 2 | 2 | 3 | 2 | 3 | 2 |
| 20 | 2 | 3 | 2 | 3 | 2 | 3 | 2 |
| 21 | 2 | 3 | 2 | 3 | 2 | 3 | 3 |
| 22 | 2 | 3 | 3 | 3 | 2 | 3 | 3 |
| 23 | 2 | 3 | 3 | 3 | 3 | 3 | 3 |
| 24 | 3 | 3 | 3 | 3 | 3 | 3 | 3 |
| 25 | 3 | 3 | 3 | 3 | 3 | 3 | 3 |
| 26 | 3 | 3 | 3 | 4 | 3 | 3 | 3 |
| 27 | 3 | 3 | 3 | 4 | 3 | 4 | 3 |
| 28 | 3 | 4 | 3 | 4 | 3 | 4 | 3 |
| 29 | 3 | 4 | 3 | 4 | 3 | 4 | 4 |
| 30 | 3 | 4 | 4 | 4 | 3 | 4 | 4 |
| 31 | 3 | 4 | 4 | 4 | 4 | 4 | 4 |
| 32 | 4 | 4 | 4 | 4 | 4 | 4 | 4 |
| 33 | 4 | 4 | 4 | 4 | 4 | 4 | 4 |
| 34 | 4 | 4 | 4 | 5 | 4 | 4 | 4 |
| 35 | 4 | 4 | 4 | 5 | 4 | 5 | 4 |
| 36 | 4 | 5 | 4 | 5 | 4 | 5 | 4 |
| 37 | 4 | 5 | 4 | 5 | 4 | 5 | 5 |
| 38 | 4 | 5 | 5 | 5 | 4 | 5 | 5 |
| 39 | 4 | 5 | 5 | 5 | 5 | 5 | 5 |
| 40 | 5 | 5 | 5 | 5 | 5 | 5 | 5 |
| 41 | 5 | 5 | 5 | 5 | 5 | 5 | 5 |
| 42 | 5 | 5 | 5 | 6 | 5 | 5 | 5 |
| 43 | 5 | 5 | 5 | 6 | 5 | 6 | 5 |
| 44 | 5 | 6 | 5 | 6 | 5 | 6 | 5 |
| 45 | 5 | 6 | 5 | 6 | 5 | 6 | 6 |
| 46 | 5 | 6 | 6 | 6 | 5 | 6 | 6 |
| 47 | 5 | 6 | 6 | 6 | 6 | 6 | 6 |
| 48 | 6 | 6 | 6 | 6 | 6 | 6 | 6 |
| 49 | 6 | 6 | 6 | 6 | 6 | 6 | 6 |
| 50 | 6 | 6 | 6 | 7 | 6 | 6 | 6 |
| 51 | 6 | 6 | 6 | 7 | 6 | 7 | 6 |
| 52 | 6 | 7 | 6 | 7 | 6 | 7 | 6 |
| 53 | 6 | 7 | 6 | 7 | 6 | 7 | 7 |
| 54 | 6 | 7 | 7 | 7 | 6 | 7 | 7 |
| 55 | 6 | 7 | 7 | 7 | 7 | 7 | 7 |
| 56 | 7 | 7 | 7 | 7 | 7 | 7 | 7 |
| 57 | 7 | 7 | 7 | 7 | 7 | 7 | 7 |
| 58 | 7 | 7 | 7 | 8 | 7 | 7 | 7 |
| 59 | 7 | 7 | 7 | 8 | 7 | 8 | 7 |

TABLE 3-continued

| 201 | 202 | 203 | 204 | 205 | 206 | 207 | 208 |
|-----|-----|-----|-----|-----|-----|-----|-----|
| 60 | 7 | 8 | 7 | 8 | 7 | 8 | 7 |
| 61 | 7 | 8 | 7 | 8 | 7 | 8 | 8 |

TABLE 4

| 201 | 222 | 223 | 224 | 225 | 226 | 227 | 228 |
|-----|-----|-----|-----|-----|-----|-----|-----|
| 1 | 0 | 0 | 0 | 0 | 0 | 0 | 0 |
| 2 | 0 | 0 | 0 | 1 | 1 | 1 | 1 |
| 3 | 0 | 0 | 0 | 1 | 1 | 2 | 2 |
| 4 | 0 | 1 | 1 | 2 | 2 | 3 | 3 |
| 5 | 0 | 1 | 1 | 2 | 2 | 3 | 4 |
| 6 | 0 | 1 | 2 | 3 | 3 | 4 | 5 |
| 7 | 0 | 1 | 2 | 3 | 4 | 5 | 6 |
| 8 | 1 | 2 | 3 | 4 | 5 | 6 | 7 |
| 9 | 1 | 2 | 3 | 4 | 5 | 6 | 7 |
| 10 | 1 | 2 | 3 | 5 | 6 | 7 | 8 |
| 11 | 1 | 2 | 3 | 5 | 6 | 8 | 9 |
| 12 | 1 | 3 | 4 | 6 | 7 | 9 | 10 |
| 13 | 1 | 3 | 4 | 6 | 7 | 9 | 11 |
| 14 | 1 | 3 | 5 | 7 | 8 | 10 | 12 |
| 15 | 1 | 3 | 5 | 7 | 9 | 11 | 13 |
| 16 | 2 | 4 | 6 | 8 | 10 | 12 | 14 |
| 17 | 2 | 4 | 6 | 8 | 10 | 12 | 14 |
| 18 | 2 | 4 | 6 | 9 | 11 | 13 | 15 |
| 19 | 2 | 4 | 6 | 9 | 11 | 14 | 16 |
| 20 | 2 | 5 | 7 | 10 | 12 | 15 | 17 |
| 21 | 2 | 5 | 7 | 10 | 12 | 15 | 18 |
| 22 | 2 | 5 | 8 | 11 | 13 | 16 | 19 |
| 23 | 2 | 5 | 8 | 11 | 14 | 17 | 20 |
| 24 | 3 | 6 | 9 | 12 | 15 | 18 | 21 |
| 25 | 3 | 6 | 9 | 12 | 15 | 18 | 21 |
| 26 | 3 | 6 | 9 | 13 | 16 | 19 | 22 |
| 27 | 3 | 6 | 9 | 13 | 16 | 20 | 23 |
| 28 | 3 | 7 | 10 | 14 | 17 | 21 | 24 |
| 29 | 3 | 7 | 10 | 14 | 17 | 21 | 25 |
| 30 | 3 | 7 | 11 | 15 | 18 | 22 | 26 |
| 31 | 3 | 7 | 11 | 15 | 19 | 23 | 27 |
| 32 | 4 | 8 | 12 | 16 | 20 | 24 | 28 |
| 33 | 4 | 8 | 12 | 16 | 20 | 24 | 28 |
| 34 | 4 | 8 | 12 | 17 | 21 | 25 | 29 |
| 35 | 4 | 8 | 12 | 17 | 21 | 26 | 30 |
| 36 | 4 | 9 | 13 | 18 | 22 | 27 | 31 |
| 37 | 4 | 9 | 13 | 18 | 22 | 27 | 32 |
| 38 | 4 | 9 | 14 | 19 | 23 | 28 | 33 |
| 39 | 4 | 9 | 14 | 19 | 24 | 29 | 34 |
| 40 | 5 | 10 | 15 | 20 | 25 | 30 | 35 |
| 41 | 5 | 10 | 15 | 20 | 25 | 30 | 35 |
| 42 | 5 | 10 | 15 | 21 | 26 | 31 | 36 |
| 43 | 5 | 10 | 15 | 21 | 26 | 32 | 37 |
| 44 | 5 | 11 | 16 | 22 | 27 | 33 | 38 |
| 45 | 5 | 11 | 16 | 22 | 27 | 33 | 39 |
| 46 | 5 | 11 | 17 | 23 | 28 | 34 | 40 |
| 47 | 5 | 11 | 17 | 23 | 29 | 35 | 41 |
| 48 | 6 | 12 | 18 | 24 | 30 | 36 | 42 |
| 49 | 6 | 12 | 18 | 24 | 30 | 36 | 42 |
| 50 | 6 | 12 | 18 | 25 | 31 | 37 | 43 |
| 51 | 6 | 12 | 18 | 25 | 31 | 38 | 44 |
| 52 | 6 | 13 | 19 | 26 | 32 | 39 | 45 |
| 53 | 6 | 13 | 19 | 26 | 32 | 39 | 46 |
| 54 | 6 | 13 | 20 | 27 | 33 | 40 | 47 |
| 55 | 6 | 13 | 20 | 27 | 34 | 41 | 48 |
| 56 | 7 | 14 | 21 | 28 | 35 | 42 | 49 |
| 57 | 7 | 14 | 21 | 28 | 35 | 42 | 49 |
| 58 | 7 | 14 | 21 | 29 | 36 | 43 | 50 |
| 59 | 7 | 14 | 21 | 29 | 36 | 44 | 51 |
| 60 | 7 | 15 | 22 | 30 | 37 | 45 | 52 |
| 61 | 7 | 15 | 22 | 30 | 37 | 45 | 53 |

In the present embodiment, the difference between each two of the time delays does not exceed 1 in terms of the number of the unit delay times, as shown in Table 3, which assures a relatively correct time interval between each adjacent two of the clock pulses in the output clock signal of the resultant frequency multiplier.

In addition, as shown in Table 4, the particular connection scheme of the delay circuits 202 to 208 and the latch array 209 provides the advantage that the output clock signal 223 of the third delay circuit 203 is close to ¼ of the delay time effected in the first delay circuit 201, the output clock signal 225 of the fifth delay circuit 205 is close to ½ of the delay time effected in the first delay circuit, and the output clock signal 227 of the seventh delay circuit 207 is close to ¾ of the delay time effected in the first delay circuit. This means that the resultant multiplier can generate, in addition to a clock signal having a octuple-multiplied frequency, another clock signal having a quadruple-multiplied frequency by combining the signals from the third, fifth and seventh clock signals 223, 225 and 227 in addition to the first clock signal 221. Further, another clock signal having a double-multiplied frequency can be also obtained by using the output signal 225 of the fifth delay circuit 205 and the first clock signal 221.

The particular connection scheme between the delay circuits 202 to 208 and the latch array 209 as described above may be modified under the condition that the clock signal in the output of the third, fifth and seventh delay circuits do not deviate from ¼, ½ and ¾, respectively, by the unit delay time. More generally, if N delay circuits are provided, the output of every other delay circuit do not deviate from 2/N, 4/N, 6/N, . . . by the unit delay time $t_d$.

Figure 5:
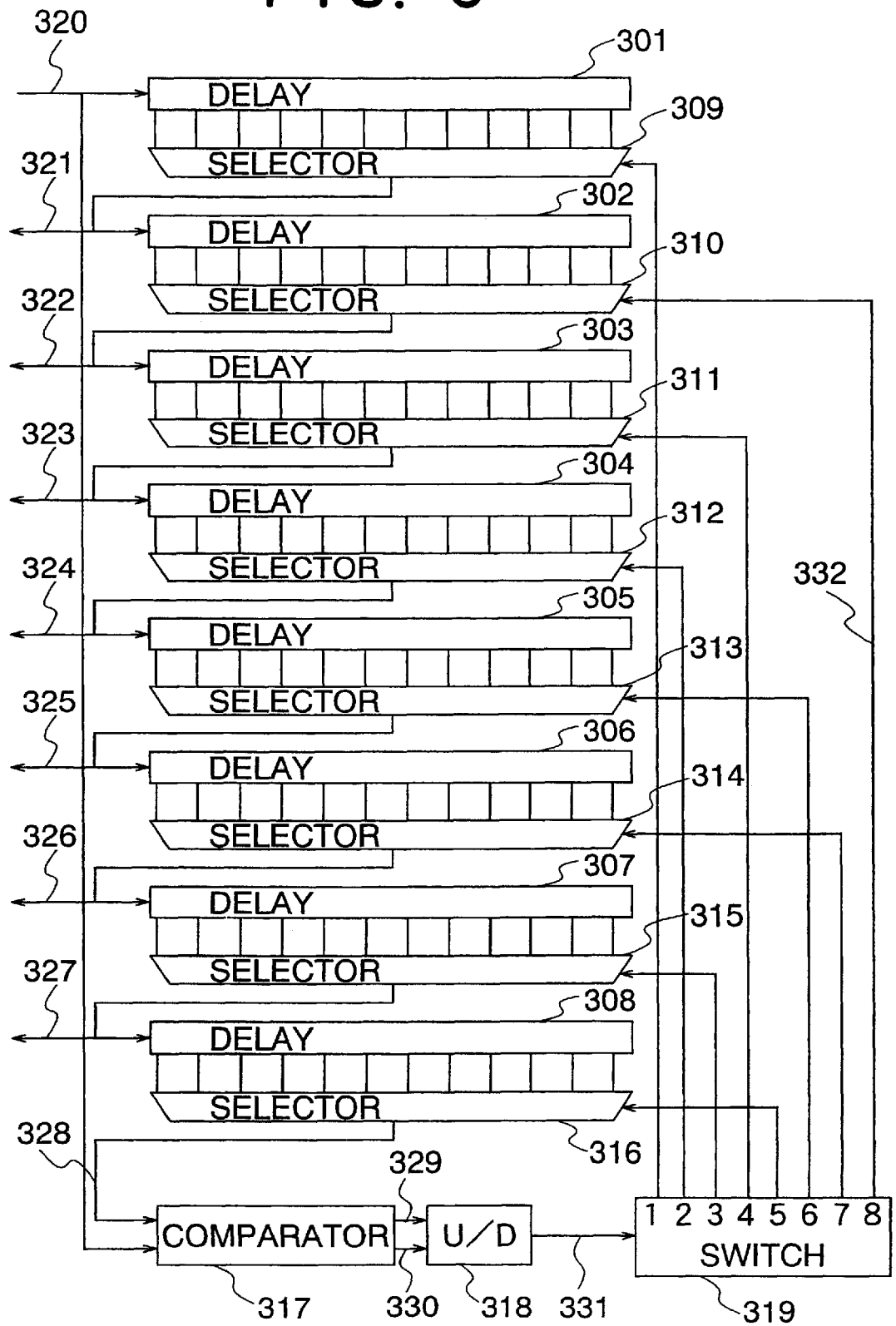
FIG. 5 is a block diagram of a combinational delay circuit according to a second embodiment of the present invention.

Referring to FIG. 5, a combinational delay circuit according to a second embodiment of the present invention comprises a plurality of (8 in this example) delay sets each including a delay circuit 301, 302, . . . , or 308 having a plurality of delay segments and a selector 309, 310, or 316 for selecting the delay segments for effecting the time delay in the corresponding delay circuit based on a control signal 332. The combinational delay circuit also comprises a comparator 317 for comparing the eighth clock signal 328 output from the eighth delay unit or eighth delay circuit 316 against the reference clock signal 320, to deliver UP-signal 329 or DOWN-signal 330 to an UP-DOWN counter 318. The UP-DOWN counter 318 controls the control switch 319 to select one of the selectors 309 to 316 in the order specified in advance. When UP-signal is generated, the selection is in an ascending order from 1 to 8 specified in the control switch 319, whereas the selection is in a descending order from 8 to 1 when DOWN-signal is generated.

In the present embodiment, the control switch 319 has a selection order from 1 to 8, which numbers consecutively correspond to the first delay circuit 301, fourth delay circuit 304, seventh delay circuit 307, third delay circuit 303, eighth delay circuit 308, fifth delay circuit 305, sixth delay circuit 307 and second delay circuit 302, based on the data stored in the control switch 319. The order 1 to 8 or 8 to 1 is cyclic: 1 follows 8 in an ascending order and 8 follows 1 in a descending order.

The outputs 321 to 328 from the first through eighth delay circuits 301 to 308 are ORed in the resultant multiplier, as in the case of the conventional frequency multiplier described in connection with FIG. 1, to generate a clock signal having a octuple-multiplied frequency.

Tables 5 and 6 show the delay time effected in each of the delay circuits 301 to 308 and the delay time appearing in the outputs 321 to 328 of the delay circuits 301 to 308, respectively, which are specified in terms of the number of unit delay times and tabulated with the total delay time of the cascaded delay circuits 301 to 308.

TABLE 5

| TOTAL | 301 | 302 | 303 | 304 | 305 | 306 | 307 | 308 |
|---|---|---|---|---|---|---|---|---|
| 1 | 0 | 0 | 0 | 0 | 0 | 0 | 0 | 1 |
| 2 | 0 | 0 | 0 | 1 | 0 | 0 | 0 | 1 |
| 3 | 0 | 0 | 0 | 1 | 0 | 1 | 0 | 1 |
| 4 | 0 | 1 | 0 | 1 | 0 | 1 | 0 | 1 |
| 5 | 0 | 1 | 0 | 1 | 0 | 1 | 1 | 1 |
| 6 | 0 | 1 | 1 | 1 | 0 | 1 | 1 | 1 |
| 7 | 0 | 1 | 1 | 1 | 1 | 1 | 1 | 1 |
| 8 | 1 | 1 | 1 | 1 | 1 | 1 | 1 | 1 |
| 9 | 1 | 1 | 1 | 1 | 1 | 1 | 1 | 2 |
| 10 | 1 | 1 | 1 | 2 | 1 | 1 | 1 | 2 |
| 11 | 1 | 1 | 1 | 2 | 1 | 2 | 1 | 2 |
| 12 | 1 | 2 | 1 | 2 | 1 | 2 | 1 | 2 |
| 13 | 1 | 2 | 1 | 2 | 1 | 2 | 2 | 2 |
| 14 | 1 | 2 | 2 | 2 | 1 | 2 | 2 | 2 |
| 15 | 1 | 2 | 2 | 2 | 2 | 2 | 2 | 2 |
| 16 | 2 | 2 | 2 | 2 | 2 | 2 | 2 | 2 |
| 17 | 2 | 2 | 2 | 2 | 2 | 2 | 2 | 3 |
| 18 | 2 | 2 | 2 | 3 | 2 | 2 | 2 | 3 |
| 19 | 2 | 2 | 2 | 3 | 2 | 3 | 2 | 3 |
| 20 | 2 | 3 | 2 | 3 | 2 | 3 | 2 | 3 |
| 21 | 2 | 3 | 2 | 3 | 2 | 3 | 3 | 3 |
| 22 | 2 | 3 | 3 | 3 | 2 | 3 | 3 | 3 |
| 23 | 2 | 3 | 3 | 3 | 3 | 3 | 3 | 3 |
| 24 | 3 | 3 | 3 | 3 | 3 | 3 | 3 | 3 |
| 25 | 3 | 3 | 3 | 3 | 3 | 3 | 3 | 4 |
| 26 | 3 | 3 | 3 | 4 | 3 | 3 | 3 | 4 |
| 27 | 3 | 3 | 3 | 4 | 3 | 4 | 3 | 4 |
| 28 | 3 | 4 | 3 | 4 | 3 | 4 | 3 | 4 |
| 29 | 3 | 4 | 3 | 4 | 3 | 4 | 4 | 4 |
| 30 | 3 | 4 | 4 | 4 | 3 | 4 | 4 | 4 |
| 31 | 3 | 4 | 4 | 4 | 4 | 4 | 4 | 4 |
| 32 | 4 | 4 | 4 | 4 | 4 | 4 | 4 | 4 |
| 33 | 4 | 4 | 4 | 4 | 4 | 4 | 4 | 5 |
| 34 | 4 | 4 | 4 | 5 | 4 | 4 | 4 | 5 |
| 35 | 4 | 4 | 4 | 5 | 4 | 5 | 4 | 5 |
| 36 | 4 | 5 | 4 | 5 | 4 | 5 | 4 | 5 |
| 37 | 4 | 5 | 4 | 5 | 4 | 5 | 5 | 5 |
| 38 | 4 | 5 | 5 | 5 | 4 | 5 | 5 | 5 |
| 39 | 4 | 5 | 5 | 5 | 5 | 5 | 5 | 5 |
| 40 | 5 | 5 | 5 | 5 | 5 | 5 | 5 | 5 |
| 41 | 5 | 5 | 5 | 5 | 5 | 5 | 5 | 6 |
| 42 | 5 | 5 | 5 | 6 | 5 | 5 | 5 | 6 |
| 43 | 5 | 5 | 5 | 6 | 5 | 6 | 5 | 6 |
| 44 | 5 | 6 | 5 | 6 | 5 | 6 | 5 | 6 |
| 45 | 5 | 6 | 5 | 6 | 5 | 6 | 6 | 6 |
| 46 | 5 | 6 | 6 | 6 | 5 | 6 | 6 | 6 |
| 47 | 5 | 6 | 6 | 6 | 6 | 6 | 6 | 6 |
| 48 | 6 | 6 | 6 | 6 | 6 | 6 | 6 | 6 |
| 49 | 6 | 6 | 6 | 6 | 6 | 6 | 6 | 7 |
| 50 | 6 | 6 | 6 | 7 | 6 | 6 | 6 | 7 |
| 51 | 6 | 6 | 6 | 7 | 6 | 7 | 6 | 7 |
| 52 | 6 | 7 | 6 | 7 | 6 | 7 | 6 | 7 |
| 53 | 6 | 7 | 6 | 7 | 6 | 7 | 7 | 7 |
| 54 | 6 | 7 | 7 | 7 | 6 | 7 | 7 | 7 |
| 55 | 6 | 7 | 7 | 7 | 7 | 7 | 7 | 7 |
| 56 | 7 | 7 | 7 | 7 | 7 | 7 | 7 | 7 |
| 57 | 7 | 7 | 7 | 7 | 7 | 7 | 7 | 8 |
| 58 | 7 | 7 | 7 | 8 | 7 | 7 | 7 | 8 |
| 59 | 7 | 7 | 7 | 8 | 7 | 8 | 7 | 8 |
| 60 | 7 | 8 | 7 | 8 | 7 | 8 | 7 | 8 |
| 61 | 7 | 8 | 7 | 8 | 7 | 8 | 8 | 8 |

TABLE 6

| TOTAL | 321 | 322 | 323 | 324 | 325 | 326 | 327 | 328 |
|---|---|---|---|---|---|---|---|---|
| 1 | 0 | 0 | 0 | 0 | 0 | 0 | 0 | 1 |
| 2 | 0 | 0 | 0 | 1 | 1 | 1 | 1 | 2 |
| 3 | 0 | 0 | 0 | 1 | 1 | 2 | 2 | 3 |
| 4 | 0 | 1 | 1 | 2 | 2 | 3 | 3 | 4 |
| 5 | 0 | 1 | 1 | 2 | 2 | 3 | 4 | 5 |
| 6 | 0 | 1 | 2 | 3 | 3 | 4 | 5 | 5 |
| 7 | 0 | 1 | 2 | 3 | 4 | 5 | 6 | 7 |
| 8 | 1 | 2 | 3 | 4 | 5 | 6 | 7 | 8 |
| 9 | 1 | 2 | 3 | 4 | 5 | 6 | 7 | 9 |
| 10 | 1 | 2 | 3 | 5 | 6 | 7 | 8 | 10 |
| 11 | 1 | 2 | 3 | 5 | 6 | 8 | 9 | 11 |
| 12 | 1 | 3 | 4 | 6 | 7 | 9 | 10 | 12 |
| 13 | 1 | 3 | 4 | 6 | 7 | 9 | 11 | 13 |
| 14 | 1 | 3 | 5 | 7 | 8 | 10 | 12 | 14 |
| 15 | 1 | 3 | 5 | 7 | 9 | 11 | 13 | 15 |
| 16 | 2 | 4 | 6 | 8 | 10 | 12 | 14 | 16 |
| 17 | 2 | 4 | 6 | 8 | 10 | 12 | 14 | 17 |
| 18 | 2 | 4 | 6 | 9 | 11 | 13 | 15 | 18 |
| 19 | 2 | 4 | 6 | 9 | 11 | 14 | 16 | 19 |
| 20 | 2 | 5 | 7 | 10 | 12 | 15 | 17 | 20 |
| 21 | 2 | 5 | 7 | 10 | 12 | 15 | 18 | 21 |
| 22 | 2 | 5 | 8 | 11 | 13 | 16 | 19 | 22 |
| 23 | 2 | 5 | 8 | 11 | 14 | 17 | 20 | 23 |
| 24 | 3 | 6 | 9 | 12 | 15 | 18 | 21 | 24 |
| 25 | 3 | 6 | 9 | 12 | 15 | 18 | 21 | 25 |
| 26 | 3 | 6 | 9 | 13 | 16 | 19 | 22 | 26 |
| 27 | 3 | 6 | 9 | 13 | 16 | 20 | 23 | 27 |
| 28 | 3 | 7 | 10 | 14 | 17 | 21 | 24 | 28 |
| 29 | 3 | 7 | 10 | 14 | 17 | 21 | 25 | 29 |
| 30 | 3 | 7 | 11 | 15 | 18 | 22 | 26 | 30 |
| 31 | 3 | 7 | 11 | 15 | 19 | 23 | 27 | 31 |
| 32 | 4 | 8 | 12 | 16 | 20 | 24 | 28 | 32 |
| 33 | 4 | 8 | 12 | 16 | 20 | 24 | 28 | 33 |
| 34 | 4 | 8 | 12 | 17 | 21 | 25 | 29 | 34 |
| 35 | 4 | 8 | 12 | 17 | 21 | 26 | 30 | 35 |
| 36 | 4 | 9 | 13 | 18 | 22 | 27 | 31 | 36 |
| 37 | 4 | 9 | 13 | 18 | 22 | 27 | 32 | 37 |
| 38 | 4 | 9 | 14 | 19 | 23 | 28 | 33 | 38 |
| 39 | 4 | 9 | 14 | 19 | 24 | 29 | 34 | 39 |
| 40 | 5 | 10 | 15 | 20 | 25 | 30 | 35 | 40 |
| 41 | 5 | 10 | 15 | 20 | 25 | 30 | 35 | 41 |
| 42 | 5 | 10 | 15 | 21 | 26 | 31 | 36 | 42 |
| 43 | 5 | 10 | 15 | 21 | 26 | 32 | 37 | 43 |
| 44 | 5 | 11 | 16 | 22 | 27 | 33 | 38 | 44 |
| 45 | 5 | 11 | 16 | 22 | 27 | 33 | 39 | 45 |
| 46 | 5 | 11 | 17 | 23 | 28 | 34 | 40 | 46 |
| 47 | 5 | 11 | 17 | 23 | 29 | 35 | 41 | 47 |
| 48 | 6 | 12 | 18 | 24 | 30 | 36 | 42 | 48 |
| 49 | 6 | 12 | 18 | 24 | 30 | 36 | 42 | 49 |
| 50 | 6 | 12 | 18 | 25 | 31 | 37 | 43 | 50 |
| 51 | 6 | 12 | 18 | 25 | 31 | 38 | 44 | 51 |
| 52 | 6 | 13 | 19 | 26 | 32 | 39 | 45 | 52 |
| 53 | 6 | 13 | 19 | 26 | 32 | 39 | 46 | 53 |
| 54 | 6 | 13 | 20 | 27 | 33 | 40 | 47 | 54 |
| 55 | 6 | 13 | 20 | 27 | 34 | 41 | 48 | 55 |
| 56 | 7 | 14 | 21 | 28 | 35 | 42 | 49 | 56 |
| 57 | 7 | 14 | 21 | 28 | 35 | 42 | 49 | 57 |
| 58 | 7 | 14 | 21 | 29 | 36 | 43 | 50 | 58 |
| 59 | 7 | 14 | 21 | 29 | 36 | 44 | 51 | 59 |
| 60 | 7 | 15 | 22 | 30 | 37 | 45 | 52 | 60 |

Similarly to the first embodiment, since the first through eighth delay circuits 301 to 308 are selected based on the predetermined order, which is stored in the control switch 319 in this embodiment, the time delay effected in each of the delay circuits 301 to 308 is controlled to have an error below $t_d$ (unit delay time of the delay segments) with respect to an integral multiple of ⅛ of the clock cycle of the clock signal obtained by the frequency multiplier.

By the configuration of the predetermined order of the selection, the order of the delay circuits is determined so that each of the output of the delay circuits does not deviate from an integral multiple of ⅛ of the clock cycle by the unit delay time. Accordingly, the error in the interval between each two of the clock pulses is below $t_d$.

In addition, the outputs of the second delay circuit 302, fourth delay circuit 304 and sixth delay circuits 306 are close to ¼, ½ and ¾, respectively, as in the case of the first embodiment. That is, the order of the selection is determined so that the deviations from ¼, ½ and ¾ are below the unit delay time $t_d$.

As a result, clock signals having double, quadruple and octuple frequencies can be obtained from the reference clock frequency by a single frequency multiplier of the present embodiment.

More generally, according to the present embodiment, N delay circuits are serially cascaded for generating a clock signal having a N-multiplied frequency from the reference clock frequency. The selection of the delay time in each of the delay circuits is such that the output of each of the delay circuits does not deviate from an integral multiple of 1/N, or 2/N etc. by the unit delay time $t_d$. Accordingly, the error in the multiplied clock frequency is below the unit delay time $t_d$.

Since the above embodiments are described only for examples, the present invention is not limited to the above embodiments and various modifications or alterations can be easily made therefrom by those skilled in the art without departing from the scope of the present invention.

What is claimed is:

1. A combinational delay circuit for multiplying a frequency of a reference clock signal, comprising:

a plurality of cascaded delay sets;

each said delay set including, a delay circuit having a plurality of cascaded delay segments;

each said cascaded delay segment having a unit delay time; and a selector for selecting an output from one of said delay segments as an output of said delay sets;

a phase comparator operable for comparing an output signal of a last stage of said cascaded delay sets, an input phase of said reference clock signal and outputting a phase difference signal; and a control section responsive to said phase difference signal operable for controlling one of said selectors for selection of one of said delay sets;

said one of said selectors being specified based on a predetermined order of selection depending on the phase difference signal.

2. A combinational delay circuit as defined in claim 1, said predetermined order is such that a phase difference between outputs from each adjacent two of said delay sets is substantially constant having an error within said unit delay time.

3. A combinational delay circuit as defined in claim 1, wherein said plurality of delay sets includes at least seven delay sets.

4. A combinational delay circuit as defined in claim 1, wherein said predetermined order of selection is such that outputs of some of said delay sets have delay timers of ¼, ½ and ¾ of a delay time of a specific one of said delay sets.

* * * * *